(12) United States Patent
Peng et al.

(10) Patent No.: US 12,336,339 B2
(45) Date of Patent: Jun. 17, 2025

(54) MICRO LIGHT EMITTING DIODE STRUCTURE AND MICRO LIGHT EMITTING DIODE DISPLAY DEVICE

(71) Applicant: PlayNitride Display Co., Ltd., MiaoLi County (TW)

(72) Inventors: You-Lin Peng, MiaoLi County (TW); Wan-Jung Peng, MiaoLi County (TW); Fei-Hong Chen, MiaoLi County (TW); Pai-Yang Tsai, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 489 days.

(21) Appl. No.: 17/748,049

(22) Filed: May 19, 2022

(65) Prior Publication Data
US 2023/0343897 A1      Oct. 26, 2023

(30) Foreign Application Priority Data
Apr. 25, 2022  (TW) .................................. 111115561

(51) Int. Cl.
*H01L 21/78*       (2006.01)
*H10H 20/831*      (2025.01)
*H10H 20/857*      (2025.01)

(52) U.S. Cl.
CPC ...... *H10H 20/8312* (2025.01); *H10H 20/857* (2025.01)

(58) Field of Classification Search
CPC ....... H01L 33/382; H01L 33/62; H01L 33/38; H01L 25/167; H01L 33/40; H01L 25/0753; H01L 27/124; H01L 27/156; H01L 33/20; H01L 33/44
USPC .......................................................... 257/211
See application file for complete search history.

(56) References Cited

U.S. PATENT DOCUMENTS

| | | | | |
|---|---|---|---|---|
| 6,500,750 B1 * | 12/2002 | Shroff | ................... | H01L 23/544 257/E21.585 |
| 7,285,858 B2 * | 10/2007 | Tsuchiya | ............... | H01L 23/293 257/E21.511 |
| 8,410,505 B2 * | 4/2013 | Chu | ...................... | H01L 33/405 257/98 |

(Continued)

FOREIGN PATENT DOCUMENTS

| | | |
|---|---|---|
| CN | 104241493 | 12/2014 |
| CN | 111463233 | 7/2020 |

(Continued)

OTHER PUBLICATIONS

"Office Action of Taiwan Counterpart Application", issued on Dec. 23, 2022, p. 1-p. 8.

(Continued)

*Primary Examiner* — Vu A Vu
(74) *Attorney, Agent, or Firm* — JCIPRNET

(57) ABSTRACT

A micro light emitting diode structure including an epitaxial structure, an electrode layer and a barrier layer is provided. The epitaxial structure has a surface. The electrode layer is disposed on the surface of the epitaxial structure. The barrier layer is disposed on the electrode layer. An orthogonal projection area of the barrier layer on the epitaxial structure is greater than and covers an orthogonal projection area of the electrode layer on the epitaxial structure.

9 Claims, 11 Drawing Sheets

(56) References Cited

U.S. PATENT DOCUMENTS

| | | | | |
|---|---|---|---|---|
| 9,006,766 | B2* | 4/2015 | Kojima | H01L 33/62 |
| | | | | 257/98 |
| 10,608,144 | B2* | 3/2020 | Huang | H01L 33/44 |
| 11,404,403 | B2* | 8/2022 | Chung | H01L 24/29 |
| 2020/0066954 | A1* | 2/2020 | Kuo | H01L 33/42 |
| 2021/0066549 | A1* | 3/2021 | Liu | H01L 33/14 |
| 2023/0335697 | A1* | 10/2023 | Hashimoto | G09F 9/00 |
| 2024/0266470 | A1* | 8/2024 | Xiong | H01L 23/488 |

FOREIGN PATENT DOCUMENTS

| | | |
|---|---|---|
| CN | 112530819 | 3/2021 |
| CN | 113284997 | 8/2021 |
| CN | 113410347 | 9/2021 |
| CN | 114300401 | 4/2022 |
| KR | 20150000108 | 1/2015 |
| TW | 201210074 | 3/2012 |
| TW | 202010152 | 3/2020 |

OTHER PUBLICATIONS

"Office Action of Korea Counterpart Application", issued on Jun. 2, 2024, pp. 1-5.
"Office Action of China Counterpart Application", issued on Mar. 27, 2025, p. 1-p. 8.

* cited by examiner

MICRO LIGHT EMITTING DIODE STRUCTURE AND MICRO LIGHT EMITTING DIODE DISPLAY DEVICE

CROSS-REFERENCE TO RELATED APPLICATION

This application claims the priority benefit of Taiwan application serial no. 111115561, filed on Apr. 25, 2022. The entirety of the above-mentioned patent application is hereby incorporated by reference herein and made a part of this specification.

BACKGROUND

Technical Field

The invention relates to a light emitting structure and a light emitting device, and particularly relates to a micro light emitting diode structure and a micro light emitting diode display device.

Description of Related Art

In an existing solder bump process, an orthogonal projection area of a barrier layer on an epitaxial structure is equal to an orthogonal projection area of an electrode layer on the epitaxial structure, so that when subsequent transfer and bonding with a display back plate is implemented to perform a reflow process, a high temperature may easily lead to formation of a metal eutectic between the solder bump and the electrode layer, thereby affecting electrical properties and structural reliability of a micro light emitting diode display device.

SUMMARY

The invention is directed to a micro light emitting diode structure, which has better electrical properties and structural reliability.

The invention is directed to a micro light emitting diode display device including the aforementioned micro light emitting diode structure, and has a better display yield.

The invention provides a micro light emitting diode structure including an epitaxial structure, an electrode layer and a barrier layer. The epitaxial structure has a surface. The electrode layer is disposed on the surface of the epitaxial structure. The barrier layer is disposed on the electrode layer. An orthogonal projection area of the barrier layer on the epitaxial structure is greater than and covers an orthogonal projection area of the electrode layer on the epitaxial structure.

The invention provides a micro light emitting diode display device including a display substrate, a plurality of micro light emitting diode structures and a solder layer. The micro light emitting diode structures are disposed on the display substrate and respectively include an epitaxial structure, an electrode layer and a barrier layer. The epitaxial structure has a surface. The electrode layer is disposed on the surface of the epitaxial structure. The barrier layer is disposed on the electrode layer. An orthogonal projection area of the barrier layer on the display substrate is greater than and covers an orthogonal projection area of the electrode layer on the display substrate. The solder layer is disposed on the barrier layer. The solder layer is bonded to the corresponding pads, so that the micro light-emitting diode structures are electrically connected to the display substrate.

Based on the above description, in the design of the micro light emitting diode structure of the invention, the orthogonal projection area of the barrier layer on the epitaxial structure is larger than and covers the orthogonal projection area of the electrode layer on the epitaxial structure. Namely, in the invention, the barrier layer is used to contact the electrode layer, which avoids a problem of eutectic formation during a subsequent reflow process. Therefore, the micro light emitting diode structure of the invention may have better electrical properties and structural reliability, and the micro light emitting diode display device using the micro light emitting diode structures of the invention may have better display yield.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
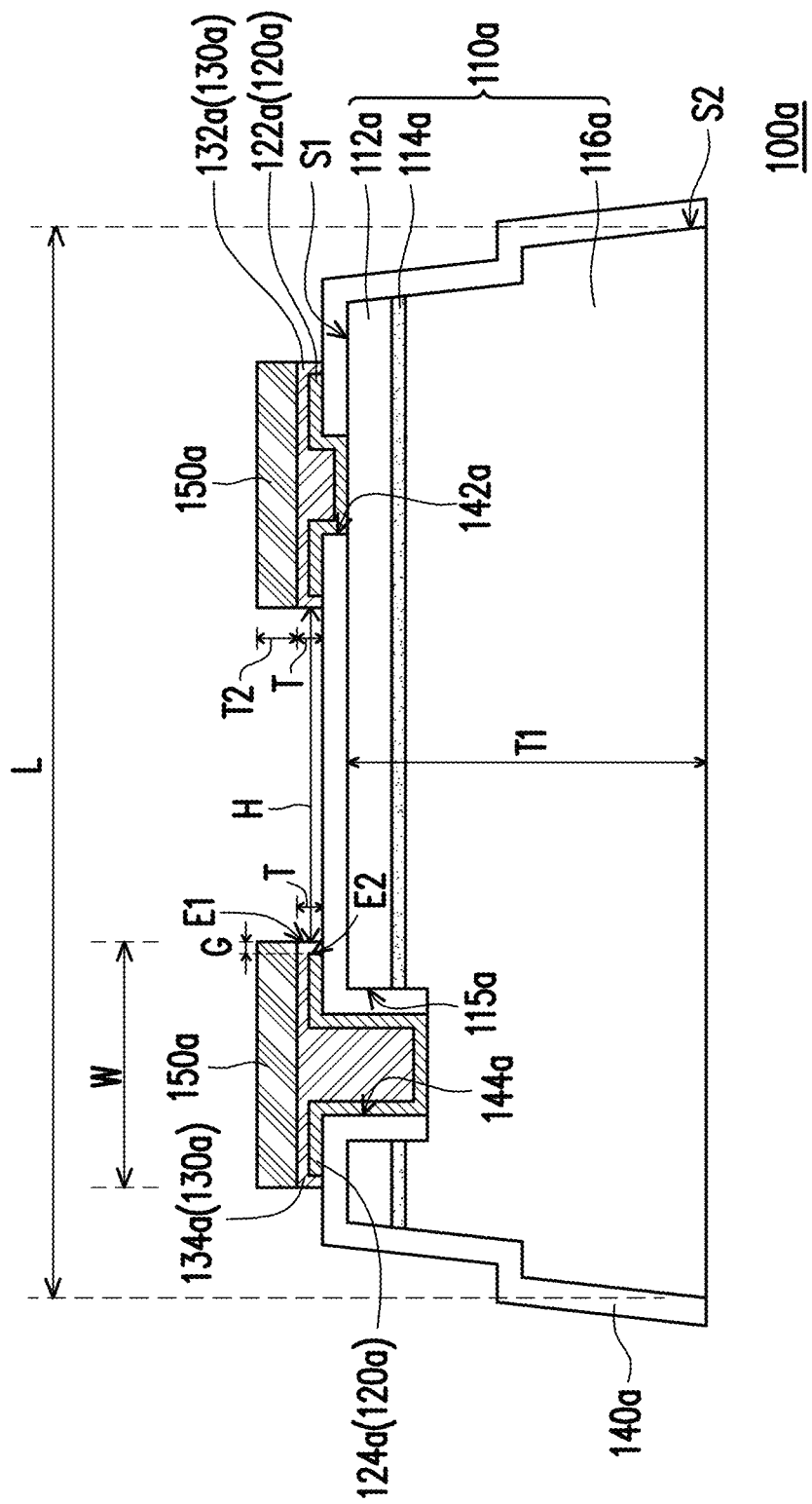
FIG. 1A is a schematic cross-sectional view of a micro light emitting diode structure according to an embodiment of the invention.
Figure 1B:
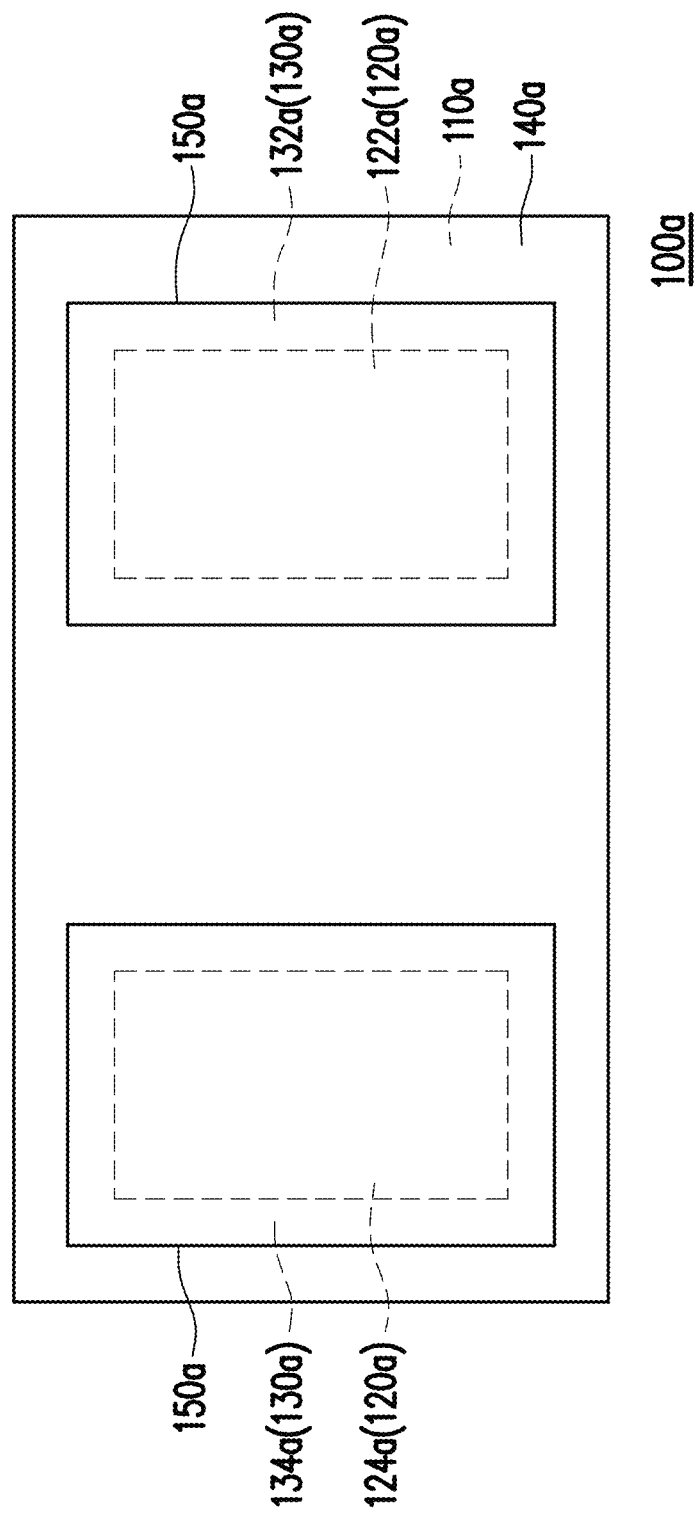
FIG. 1B is a schematic top view of the micro light emitting diode structure of FIG. 1A.

FIG. 1A is a schematic cross-sectional view of a micro light emitting diode structure according to an embodiment of the invention. FIG. 1B is a schematic top view of the micro light emitting diode structure of FIG. 1A. Referring to FIG. 1A first, in the embodiment, the micro light emitting diode structure 100a includes an epitaxial structure 110a, an electrode layer 120a and a barrier layer 130a. The epitaxial structure 110a has a surface S1. The electrode layer 120a is disposed on the surface S1 of the epitaxial structure 110a. The barrier layer 130a is disposed on the electrode layer 120a. An orthogonal projection area of the barrier layer 130a on the epitaxial structure 110a is greater than and covers an orthogonal projection area of the electrode layer 120a on the epitaxial structure 110a. Namely, the barrier layer 130a may contact the electrode layer 120a avoid a eutectic phenomenon generated during a subsequent reflow process, which ensures that the micro light emitting diode structure 100a of the embodiment has better electrical properties and structural reliability.

In detail, in the embodiment, the epitaxial structure 110a includes a first-type semiconductor layer 112a, a light emitting layer 114a, a second-type semiconductor layer 116a, and a through hole 115a. The light emitting layer 114a is located between the first-type semiconductor layer 112a and the second-type semiconductor layer 116a. The through hole 115a penetrates through the first-type semiconductor layer 112a, the light emitting layer 114a and a part of the second-type semiconductor layer 116a. One of the first-type semiconductor layer 112a and the second-type semiconductor layer 116a is a P-type semiconductor layer, and the other one of the first-type semiconductor layer 112a and the second-type semiconductor layer 116a is an N-type semiconductor layer. In addition, the micro light emitting diode structure 100a of the embodiment further includes an insulating layer 140a disposed on the epitaxial structure 110a and covering the surface S1 and a peripheral surface S2 of the epitaxial structure 110a. The insulating layer 140a has a first opening 142a exposing the first-type semiconductor layer 112a and a second opening 144a exposing the second-type semiconductor layer 116a, where the insulating layer 140a extends to cover an inner wall of the through hole 115a. Here, a cross-sectional profile of the epitaxial structure 110a is, for example, a trapezoidal profile, where a side surface of the first type semiconductor layer 112a, a side surface of the light emitting layer 114a and a side surface of the second type semiconductor layer 116a in the epitaxial structure 110a may be connected and extended obliquely in two stages, and the insulating layer 140a is disposed on the epitaxial structure 110a along the profile of the epitaxial structure 110a to achieve better yield.

Moreover, the electrode layer 120a in the embodiment includes a first electrode 122a and a second electrode 124a. The first electrode 122a is disposed on the insulating layer 140a and extends into the first opening 142a and is electrically connected to the first-type semiconductor layer 112a. The second electrode 124a is disposed on the insulating layer 140a and extends into the second opening 144a and is electrically connected to the second-type semiconductor layer 116a. The electrode layer 120a is, for example, a multi-layer film structure, where a material of the electrode layer 120a is, for example, copper, aluminum, platinum, titanium, gold, silver, chromium, or a combination thereof, but the invention is not limited thereto. Here, the first electrode 122a and the second electrode 124a are both located on the same side of the epitaxial structure 110a, which means that the micro light emitting diode structure 100a of the embodiment is embodied as a flip-chip micro light emitting diode structure.

In addition, the barrier layer 130a of the embodiment includes a first barrier portion 132a and a second barrier portion 134a. The first barrier portion 132a covers the first electrode 122a and contacts the insulating layer 140a and the first electrode 122a. The second barrier portion 134a covers the second electrode 124a and contacts the insulating layer 140a and the second electrode 124a. Here, the first barrier portion 132a and the second barrier portion 134a have flat surfaces on the side away from the first electrode 122a and the second electrode 124a.

Preferably, in the embodiment, the orthogonal projection area of the electrode layer 120a on the epitaxial structure 110a and the orthogonal projection area of the barrier layer 130a on the epitaxial structure 110a are preferably less than or equal to 0.95 and greater than or equal to 0.5, which may ensure that the barrier layer 130a completely covers the electrode layer 120a to provide sufficient protection during a subsequent bonding process. In addition, a ratio of a thickness T of the barrier layer 130a to a thickness T1 of the epitaxial structure 110a in this embodiment is preferably less than or equal to 0.1. If the ratio is above 0.1, it will affect subsequent electrical contact properties. Referring to FIG. 1A again, there is a gap G between a first edge E1 of the barrier layer 130a and a second edge E2 of the corresponding electrode layer 120a (for example, a gap between the second barrier portion 134a and the second electrode 124a), and a ratio of the gap G to a width W of the barrier layer 130a is greater than or equal to 0.05 and less than or equal to 0.5, where the gap G is, for example, greater than or equal to 0.3 μm and less than or equal to 10 μm, which may ensure that the barrier layer 130a completely covers the electrode layer 120a to provide sufficient protection. In addition, there is a horizontal distance H between the first barrier portion 132a and the second barrier portion 134a, and a ratio of the horizontal distance H to a width L of the epitaxial structure 110a in the same direction is greater than or equal to 0.01 and less than or equal to 0.3, where the horizontal distance H, for example, is between 0.3 μm and 15 μm, which may avoid a phenomenon of short circuit during the subsequent bonding process.

In addition, referring to FIG. 1A and FIG. 1B again, in the embodiment, the micro light emitting diode structure 100a further includes a solder layer 150a disposed on the barrier layer 130a. Here, an orthogonal projection area of the solder layer 150a on the epitaxial structure 110a is, for example, equal to the orthogonal projection area of the barrier layer 130a on the epitaxial structure 110a. Namely, the solder layer 150a and the barrier layer 130a may be operated with a same photolithography process, which may effectively reduce the production cost. Moreover, in the embodiment, a ratio of the thickness T of the barrier layer 130a to a thickness T2 of the solder layer 150a is less than or equal to 0.2, preferably, 0.03 to 0.2. In addition, a melting point of the barrier layer 130a is greater than a melting point of the solder layer 150a, so as to effectively block the solder layer 150a and the electrode layer 120a. A material of the solder layer 150a is, for example, tin or tin alloy, and a material of the barrier layer 130a is, for example, nickel, platinum, titanium-tungsten or tungsten, but the invention is not limited thereto.

Figure 1C:
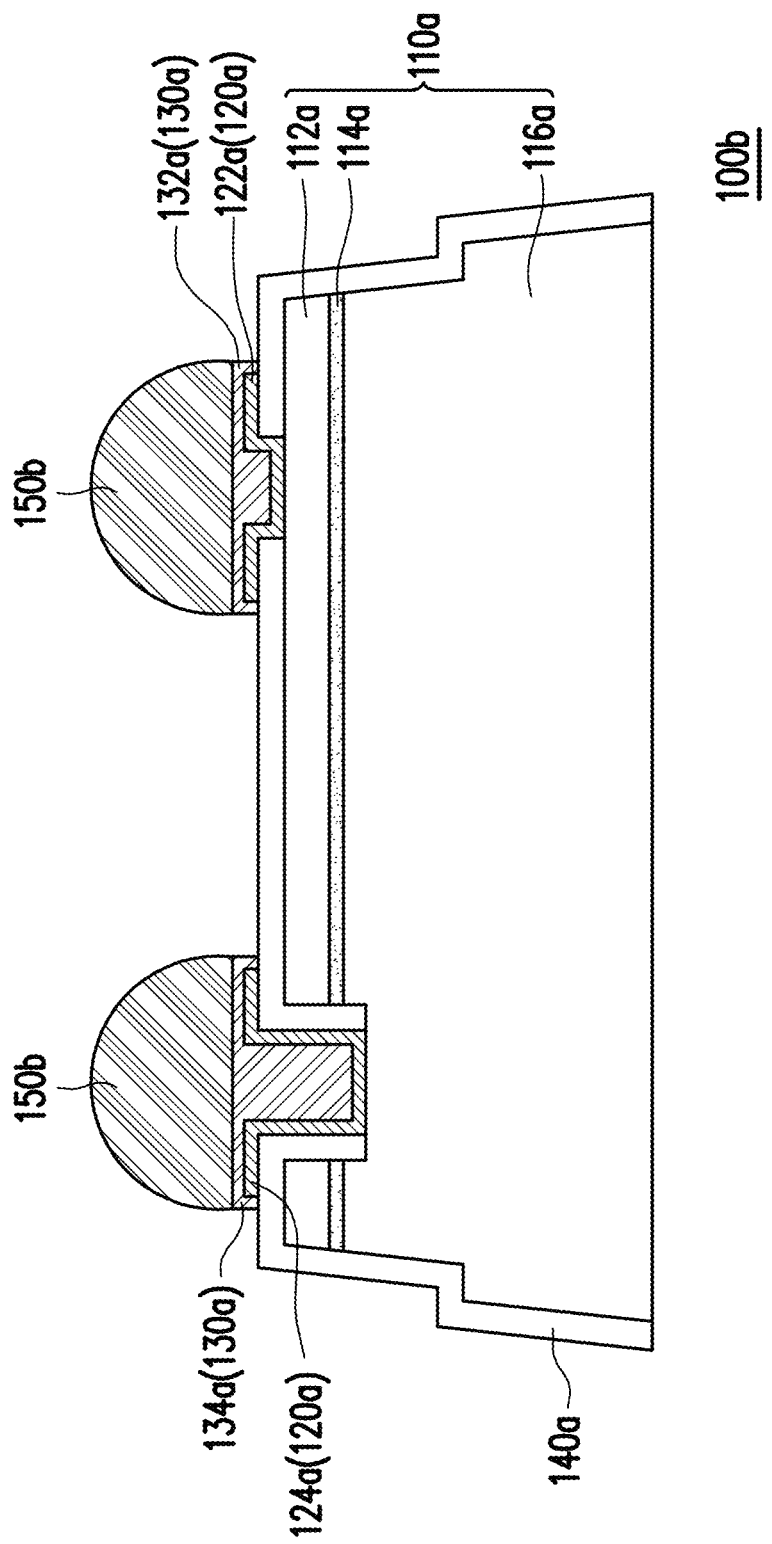
FIG. 1C is a schematic cross-sectional view of a micro light emitting diode structure according to another embodiment of the invention.

In brief, in the embodiment, the orthogonal projection area of the barrier layer 130a on the epitaxial structure 110a is larger than and covers the orthogonal projection area of the electrode layer 120a on the epitaxial structure 110a. Namely, in the embodiment, the barrier layer 130a is used to contact the electrode layer 120a, thereby effectively blocking the solder layer 150a and the electrode layer 120a, so as to avoid a problem that the solder layer 150a and the electrode layer 120a form eutectic during a subsequent reflow process. Therefore, the micro light emitting diode structure 100a of the embodiment may have better electrical properties and structural reliability. It should be noted that, as shown in FIG. 1C, in the micro light emitting diode structure 100b, the solder layer 150b may also be embodied as two solder balls.

It should be noted that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
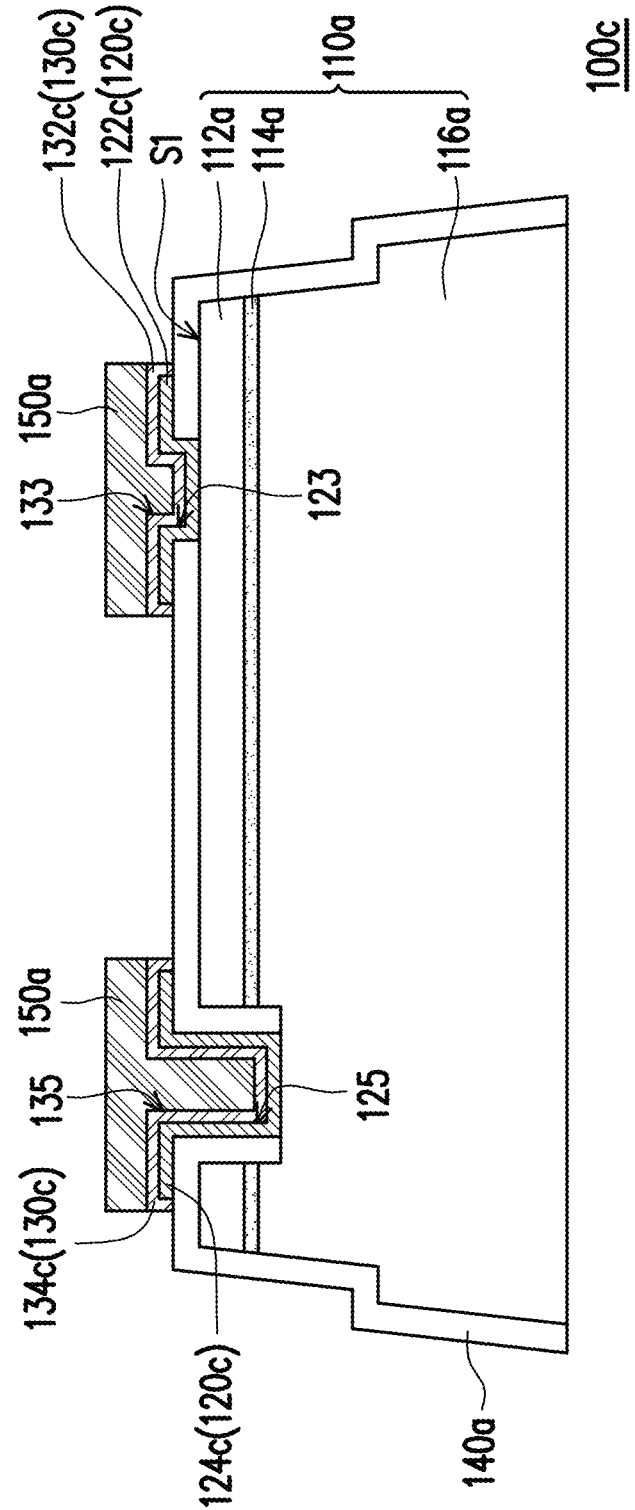
FIG. 2 is a schematic cross-sectional view of a micro light emitting diode structure according to another embodiment of the invention.

FIG. 2 is a schematic cross-sectional view of a micro light emitting diode structure according to another embodiment of the invention. Referring to FIG. 1A and FIG. 2 at the same time, a micro light emitting diode structure 100c of the embodiment is similar to the micro light emitting diode structure 100a of FIG. 1A, and a difference there between is that in the embodiment, a first electrode 122c of an electrode layer 120c has a first groove 123, and a second electrode 124c has a second groove 125. A first barrier portion 132c of a barrier layer 130c extends into the first groove 123 and is conformally disposed with the first electrode 122c. Namely, the first barrier portion 132c also has a groove 133. A second barrier portion 134c of the barrier layer 130c extends into the second groove 125 and is conformally disposed with the second electrode 124c. Namely, the second barrier portion 134c also has a groove 135. The solder layer 150a is disposed on the first barrier portion 132c and the second barrier portion 134c, and fills the groove 133 of the first barrier portion 132c and the groove 135 of the second barrier portion 134c, so as to form an accommodating space through the groove 133 and the groove 135 during the subsequent bonding process, which may effectively avoid the contact between the electrode layer 120c and the barrier layer 130c.

Figure 3:
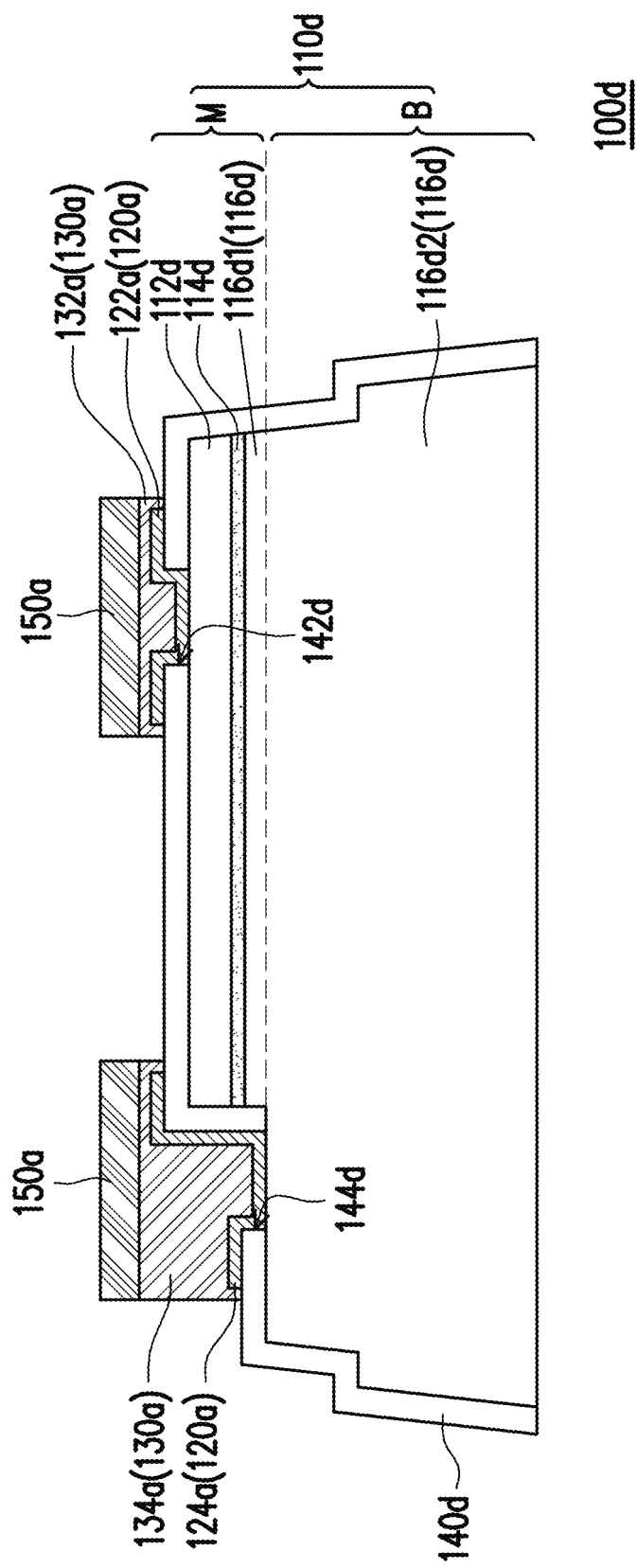
FIG. 3 is a schematic cross-sectional view of a micro light emitting diode structure according to another embodiment of the invention.

FIG. 3 is a schematic cross-sectional view of a micro light emitting diode structure according to another embodiment of the invention. Referring to FIG. 1A and FIG. 3 at the same time, a micro light emitting diode structure 100d of the embodiment is similar to the micro light emitting diode structure 100a of FIG. 1A, and a difference there between is that in the embodiment, a pattern of an epitaxial structure 110d is different from that of the epitaxial structure 110a. In detail, in the embodiment, a first-type semiconductor layer 112d, a light emitting layer 114d and a first portion 116d1 of a second-type semiconductor layer 116d form a mesa M. A second portion 116d2 of the second-type semiconductor layer 116d forms a base B with respect to the mesa M. A first opening 142d of an insulating layer 140d is located on the mesa M, and a second opening 144d exposes the second portion 116d2 of the second-type semiconductor layer 116d and is located on the base B. To be specific, the micro light emitting diode structure 100d is, for example, a horizontal micro light emitting diode structure.

Figure 4:
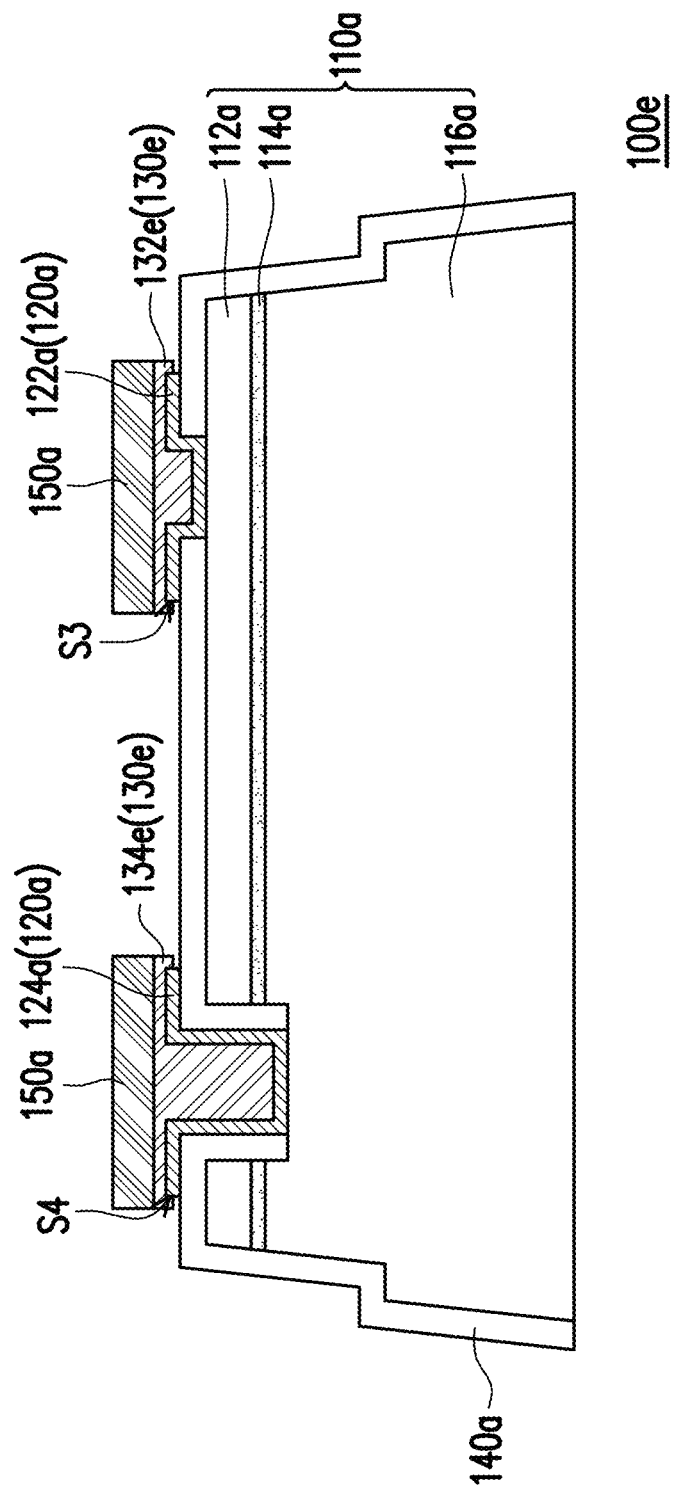
FIG. 4 is a schematic cross-sectional view of a micro light emitting diode structure according to another embodiment of the invention.

FIG. 4 is a schematic cross-sectional view of a micro light emitting diode structure according to another embodiment of the invention. FIG. 1A and FIG. 4 at the same time, a micro light emitting diode structure 100e of the embodiment is similar to the micro light emitting diode structure 100a of FIG. 1A, and a difference there between is that in the embodiment, a barrier layer 130e at least contacts a part of a peripheral surface of the electrode layer 120a. In detail, a first barrier portion 132e contacts a part of a peripheral surface S3 of the first electrode 122a, and a second barrier portion 134e contacts a part of a peripheral surface S4 of the second electrode 124a. Namely, the peripheral surface S3 of the first electrode 122a and the peripheral surface S4 of the second electrode 124a are not completely covered by the first barrier portion 132e and the second barrier portion 134e, so that there is more allowable space in the subsequent bonding process, and the barrier layer 130e may be deformed to cover the peripheral surface S3 of the first electrode 122a and the peripheral surface S4 of the second electrode 124a at the same time under high pressure and high temperature, so as to avoid short circuit caused by overflow bonding.

Figure 5:
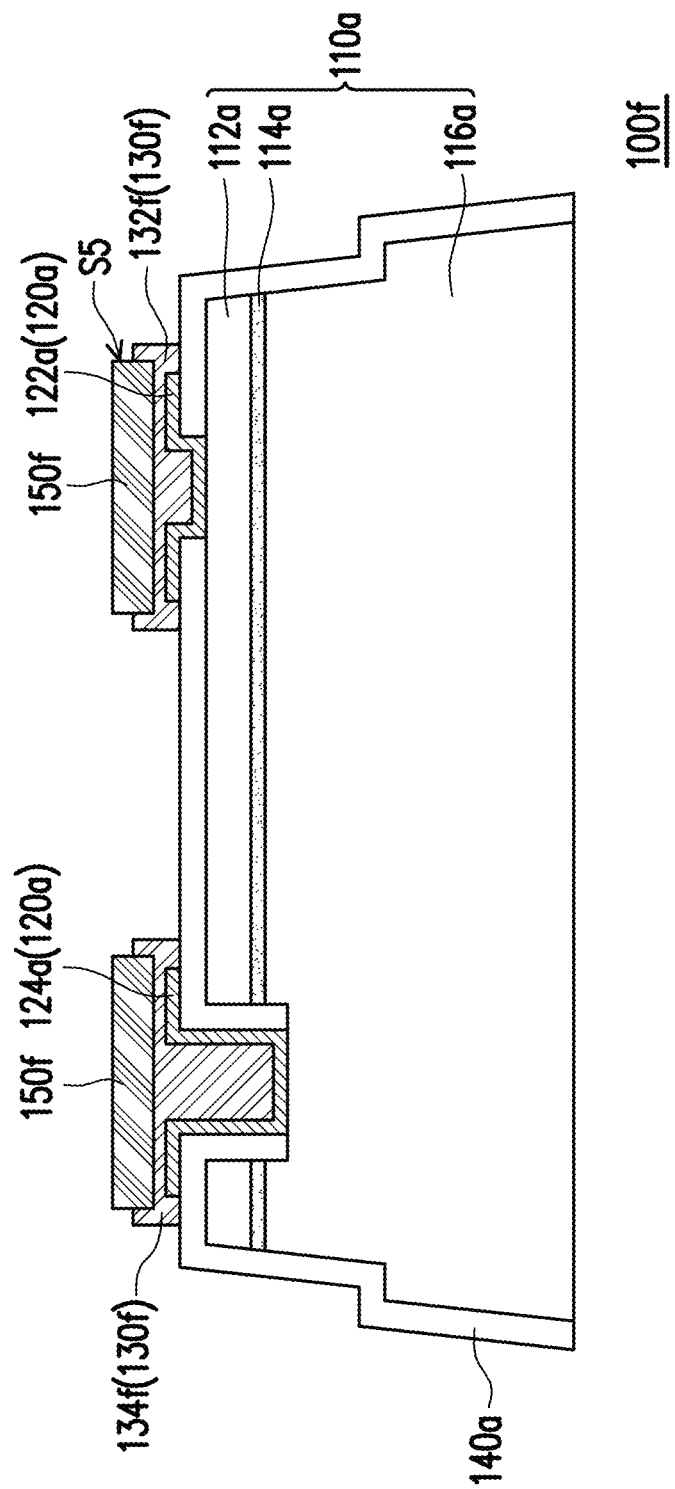
FIG. 5 is a schematic cross-sectional view of a micro light emitting diode structure according to another embodiment of the invention.

FIG. 5 is a schematic cross-sectional view of a micro light emitting diode structure according to another embodiment of the invention. Referring to FIG. 1A and FIG. 5 at the same time, a micro light emitting diode structure 100f of the embodiment is similar to the micro light emitting diode structure 100a of FIG. 1A, and a difference there between is that in the embodiment, a barrier layer 130f contacts a part of a peripheral surface S5 of a solder layer 150f. In detail, a first barrier portion 132f and a second barrier portion 134f contact a part of the peripheral surface S5 of the corresponding solder layer 150f, so as to prevent the solder layer 150f from overflowing after the reflow process.

Figure 6:
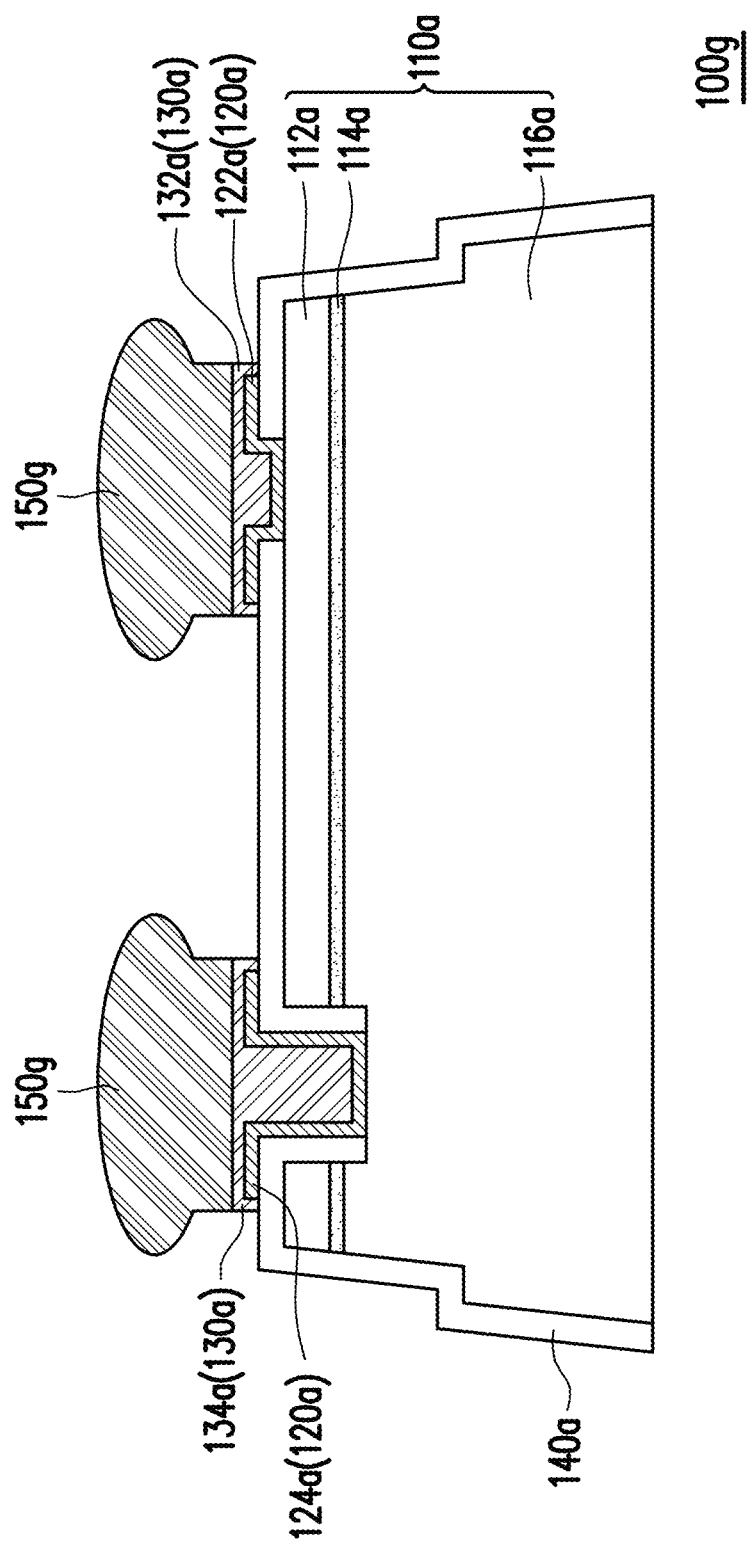
FIG. 6 is a schematic cross-sectional view of a micro light emitting diode structure according to another embodiment of the invention.

FIG. 6 is a schematic cross-sectional view of a micro light emitting diode structure according to another embodiment of the invention. Referring to FIG. 1A and FIG. 6 at the same time, a micro light emitting diode structure 100g of the embodiment is similar to the micro light emitting diode structure 100a of FIG. 1A, and a difference there between is that in the embodiment, an orthogonal projection area of a solder layer 150g on the epitaxial structure 110a is larger than an orthogonal projection area of the barrier layer 130a on the epitaxial structure 110a. Namely, different processes may be adopted to fabricate the solder layer 150g and the barrier layer 130a, which not only effectively blocks the solder layer 150a and the electrode layer 120a, but also increases a bonding area when the solder layer 150a is subsequently bonded to pads of a display back plate.

Figure 7:
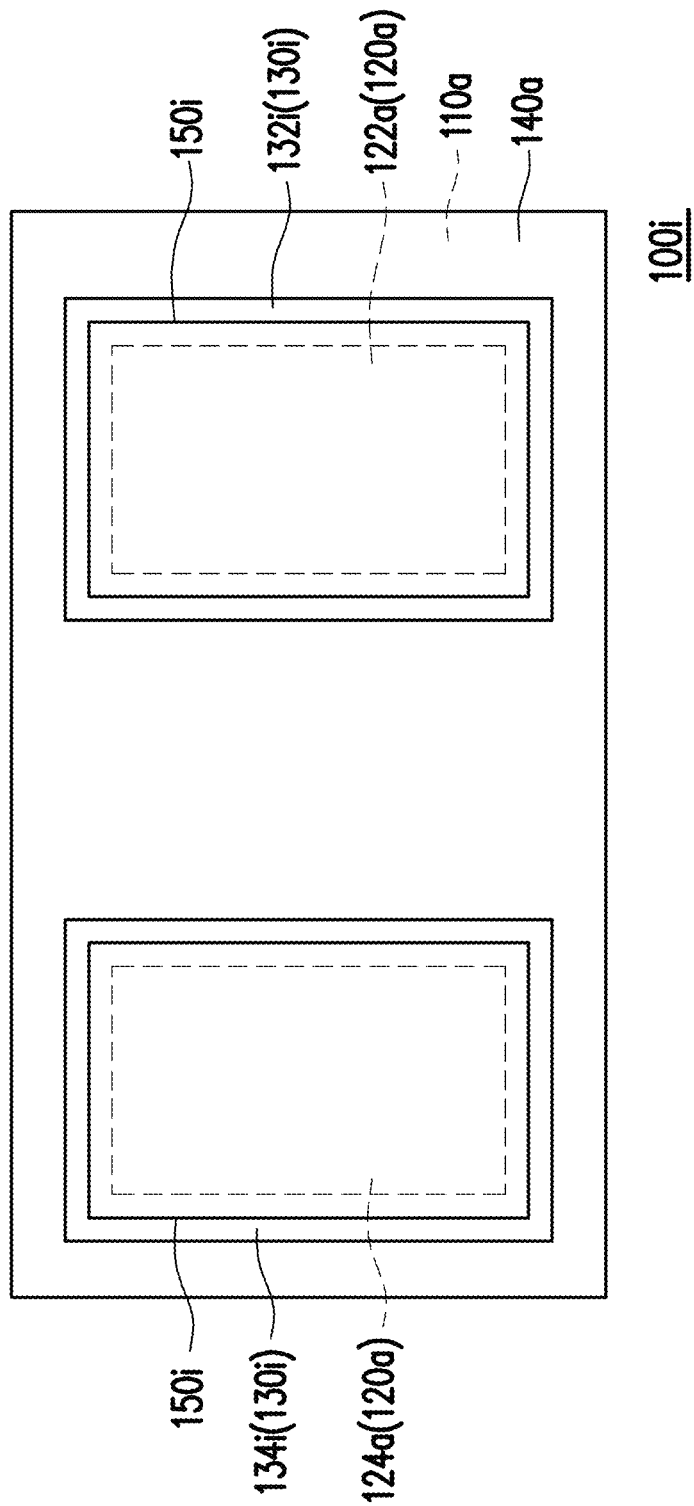
FIG. 7 is a schematic top view of a micro light emitting diode structure according to another embodiment of the invention.

FIG. 7 is a schematic top view of a micro light emitting diode structure according to another embodiment of the invention. Referring to FIG. 1B and FIG. 7 at the same time, a micro light emitting diode structure 100i of the embodiment is similar to the micro light emitting diode structure 100a of FIG. 1B, and a difference there between is that in the embodiment, an orthogonal projection area of a solder layer 150i on the epitaxial structure 110a is smaller than an orthogonal projection area of a barrier layer 130i on the epitaxial structure 110a and larger than an orthogonal projection area of the electrode layer 120a on the epitaxial structure 110a. Namely, the orthogonal projection area of the solder layer 150i on the epitaxial structure 110a is smaller than the orthogonal projection area of the corresponding first barrier portion 132i on the epitaxial structure 110a and larger than the orthogonal projection area of the first electrode 122a on the epitaxial structure 110a. The orthogonal projection area of the solder layer 150i on the epitaxial structure 110a is smaller than the orthogonal projection area of the corresponding second barrier portion 134i on the epitaxial structure 110a and larger than the orthogonal projection area of the second electrode 124a on the epitaxial structure 110a. Preferably, a ratio of the orthogonal projection area of the solder layer 150i on the epitaxial structure 110a to the orthogonal projection area of the barrier layer 130i on the epitaxial structure 110a is, for example, less than or equal to 0.9 and greater than or equal to 0.5, and if the above ratio is less than 0.5, a bonding strength of the subsequently bonded solder layer 150i may be insufficient, and a ratio of the orthogonal projection area of the solder layer 150i on the epitaxial structure 110a to the orthogonal projection area of the electrode layer 120a on the epitaxial structure 110a is, for example, greater than 1 and less than or equal to 1.5.

Figure 8:
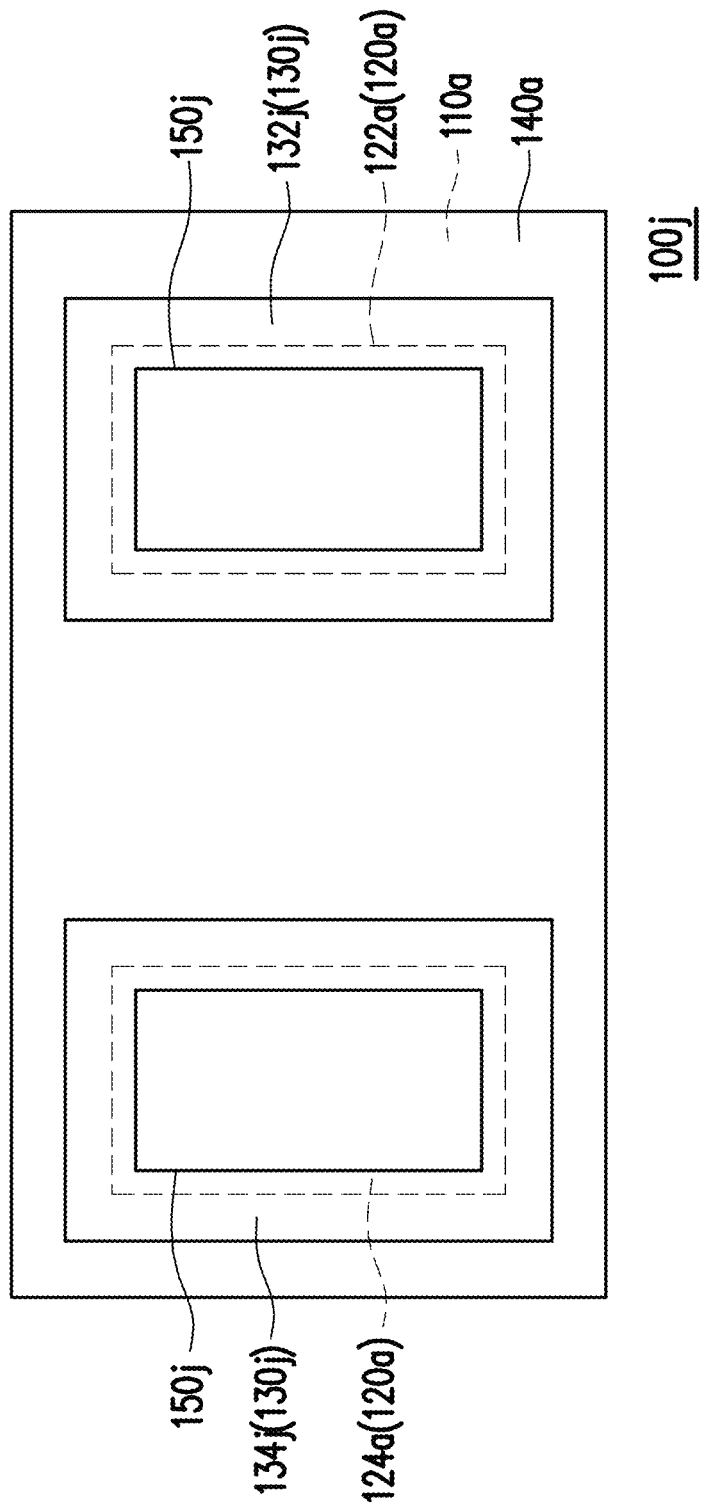
FIG. 8 is a schematic top view of a micro light emitting diode structure according to another embodiment of the invention.

Since the orthogonal projection area of the solder layer 150i on the epitaxial structure 110a is smaller than the orthogonal projection area of the barrier layer 130i on the epitaxial structure 110a, i.e., the solder layer 150i is retracted by a distance relative to the barrier layer 130i, a risk of overflow of the solder layer 150i during the subsequent reflow process is effectively reduced. As shown in FIG. 8, an orthogonal projection area of a solder layer 150j on the epitaxial structure 110a is smaller than an orthogonal projection area of a barrier layer 130j on the epitaxial structure 110a and an orthogonal projection area of the electrode layer 120a on the epitaxial structure 110a, when the applied micro light emitting diode structure 100j is smaller, for example, smaller than or equal to 15 μm, the solder layer 150j and the electrode layer 120a may be effectively blocked.

Figure 9:
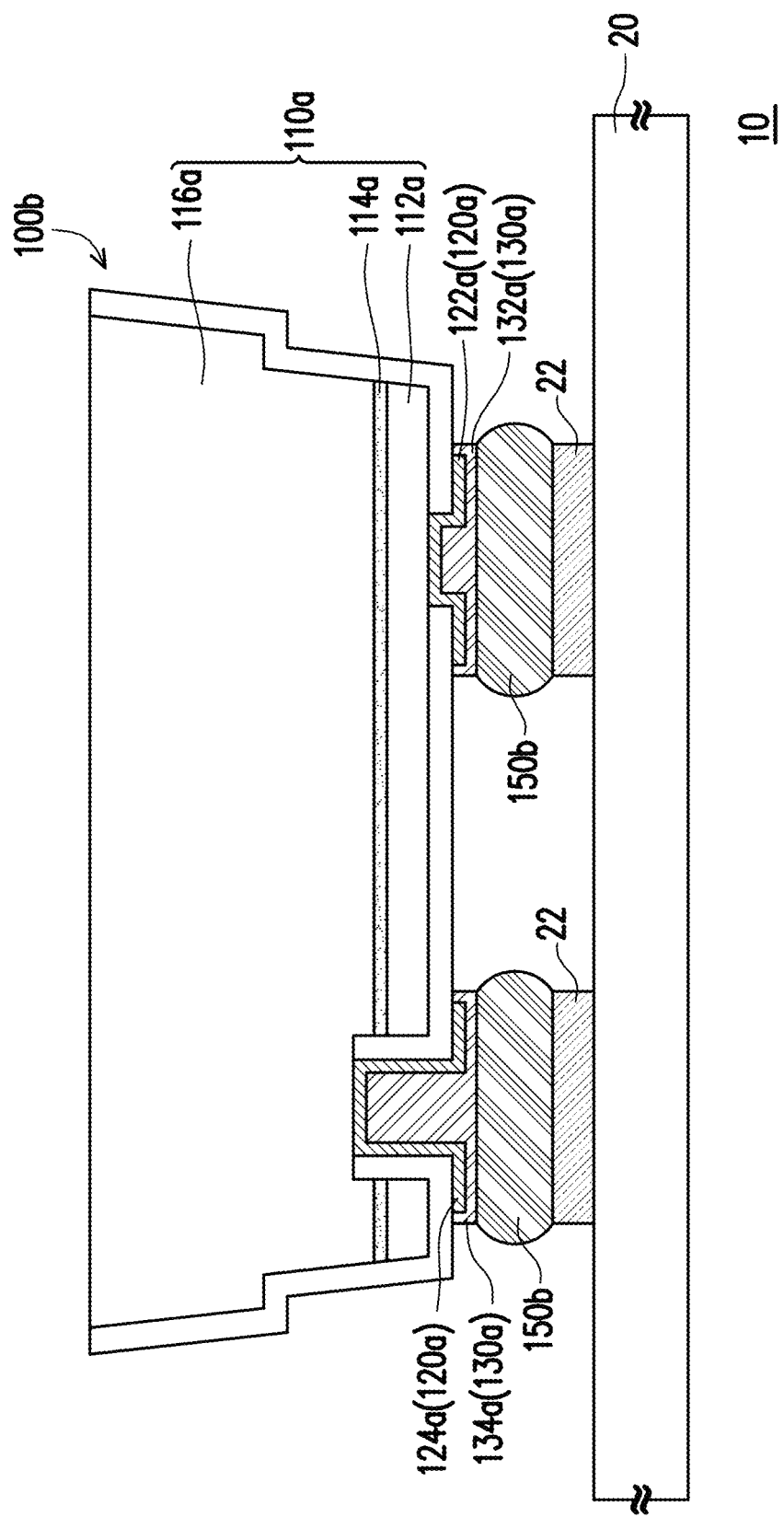
FIG. 9 is a schematic cross-sectional view of a micro light emitting diode display device according to an embodiment of the invention.

FIG. 9 is a schematic cross-sectional view of a micro light emitting diode display device according to an embodiment of the invention. Referring to FIG. 9, in the embodiment, the micro light emitting diode display device 10 includes a display substrate 20 and, for example, the micro light emitting diode structure 100b shown in FIG. 1C, where the micro light emitting diode structure 100b is disposed on the display substrate 20. In detail, in the embodiment, the display substrate 20 includes a plurality of pads 22, and the solder layer 150b is bonded to the pads 22, so that the micro light emitting diode structure 100b is disposed on the display substrate 20 and is electrically connected to the display substrate 20. An orthogonal projection area of the barrier layer 130a on the display substrate 20 is larger than and covers an orthogonal projection area of the electrode layer 120a on the display substrate 20, which may effectively avoid a problem that the solder layer 150b overflows to form a eutectic with the first electrode 122a and the second electrode 124a of the electrode layer 120a due to a high temperature and high pressure process of eutectic bonding when the micro light emitting diode structure 100b is bonded to the display substrate 20. Here, the orthogonal projection area of the barrier layer 130a on the display substrate 20 is larger than the orthogonal projection area of the electrode layer 120a on the display substrate 20 and less than or equal to an orthogonal projection area of the pad 22 on the display substrate 20. The orthogonal projection area of the solder layer 150b on the display substrate 20 is greater than or equal to the orthogonal projection area of the barrier layer 130a on the display substrate 20, which may effectively protect the solder layer 150b from overflowing when the micro light emitting diode structure 100b is bonded to the display substrate 20, and meanwhile achieves better bonding through a larger pad area and solder layer area, when the applied micro light emitting diode structure 100b is larger, for example, larger than or equal to 15 μm. Therefore, the micro light emitting diode display device 10 of the embodiment may have a better display yield.

It should be noted that in other embodiments that are not shown, the micro light emitting diode display device may include at least any one of the micro light emitting diode structures 100a, 100b, 100c, 100d, 100e, 100f, 100g, 100i, 100j according to actual requirements, which is not limited by the invention. Namely, the number of the micro light emitting diode structures may be one or plural, and the micro light emitting diode structures may be the same structure or different structures, which may be selected according to actual requirements. In addition, the micro light emitting diode structure may be a red micro light emitting diode structure, a blue micro light emitting diode structure or a green micro light emitting diode structure. Moreover, the display substrate 20 of the embodiment may be, for example, a complementary metal-oxide-semiconductor (CMOS) substrate, a liquid crystal on silicon (LCOS) substrate, a thin film transistor (TFT) substrate or other substrates with working circuits, which are not limited by the invention.

In summary, in the design of the micro light emitting diode structure of the invention, the orthogonal projection area of the barrier layer on the epitaxial structure is larger than and covers the orthogonal projection area of the electrode layer on the epitaxial structure. Namely, in the invention, the barrier layer is used to contact the electrode layer, which avoids a problem of eutectic formation during the subsequent reflow process. Therefore, the micro light emitting diode structure of the invention may have better electrical properties and structural reliability, and the micro light emitting diode display device using the micro light emitting diode structures of the invention may have better display yield.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A micro light emitting diode structure, comprising:
an epitaxial structure, having a surface;
an electrode layer, disposed on the surface of the epitaxial structure, wherein the electrode layer comprises a first electrode and a second electrode;
a barrier layer, disposed on the electrode layer, wherein an orthogonal projection area of the barrier layer on the epitaxial structure is greater than and covers an orthogonal projection area of the electrode layer on the epitaxial structure, wherein the barrier layer at least contacts a part of a peripheral surface of the electrode layer, wherein the barrier layer comprises a first barrier portion and a second barrier portion, the first barrier portion covers the first electrode, the second barrier portion covers the second electrode; and
an insulating layer, disposed on the epitaxial structure and covering the surface and a peripheral surface of the epitaxial structure, wherein the epitaxial structure comprises a first-type semiconductor layer, a light emitting layer and a second-type semiconductor layer, the light emitting layer is located between the first-type semiconductor layer and the second-type semiconductor layer, the insulating layer has a first opening exposing the first-type semiconductor layer and a second opening exposing the second-type semiconductor layer, the first electrode is disposed on the insulating layer and extends into the first opening and is electrically connected with the first-type semiconductor layer, and the second electrode is disposed on the insulating layer and extends into the second opening and is electrically connected with the second-type semiconductor layer;
wherein the first electrode has a first groove, the second electrode has a second groove, and the first barrier portion extends into the first groove and is conformally disposed with the first electrode, and the second barrier portion extends into the second groove and is conformally disposed with the second electrode.

2. The micro light emitting diode structure as claimed in claim 1, wherein the first barrier portion contacts the insulating layer and the first electrode, and the second barrier portion contacts the insulating layer and the second electrode.

3. The micro light emitting diode structure as claimed in claim 1, wherein a ratio of a thickness of the barrier layer to a thickness of the epitaxial structure is less than or equal to 0.1.

4. The micro light emitting diode structure as claimed in claim 1, wherein there is a horizontal distance between the first barrier portion and the second barrier portion, and a ratio of the horizontal distance to a width of the epitaxial structure in the same direction is greater than or equal to 0.01 and less than or equal to 0.3.

5. The micro light emitting diode structure as claimed in claim 1, wherein a ratio of the orthogonal projection area of the electrode layer on the epitaxial structure to the orthogonal projection area of the barrier layer on the epitaxial structure is less than or equal to 0.95 and greater than or equal to 0.5.

6. The micro light emitting diode structure as claimed in claim 1, wherein there is a gap between a first edge of the barrier layer and a second edge of the electrode layer, and a ratio of the gap to a width of the barrier layer is greater than or equal to 0.05 and less than or equal to 0.5.

7. The micro light emitting diode structure as claimed in claim 1, further comprising:
a solder layer, disposed on the barrier layer, wherein a ratio of a thickness of the barrier layer to a thickness of the solder layer is less than or equal to 0.2.

8. The micro light emitting diode structure as claimed in claim 7, wherein an orthogonal projection area of the solder layer on the epitaxial structure is less than or equal to the orthogonal projection area of the barrier layer on the epitaxial structure.

9. A micro light emitting diode display device, comprising:
a display substrate, comprising a plurality of pads;
a plurality of micro light emitting diode structures, disposed on the display substrate and respectively comprising:
an epitaxial structure, having a surface;
an electrode layer, disposed on the surface of the epitaxial structure, wherein the electrode layer comprises a first electrode and a second electrode;
a barrier layer, disposed on the electrode layer, wherein an orthogonal projection area of the barrier layer on the display substrate is greater than and covers an orthogonal projection area of the electrode layer on the display substrate, wherein the barrier layer at least contacts a part of a peripheral surface of the electrode layer, wherein the barrier layer comprises a first barrier portion and a second barrier portion, the first barrier portion covers the first electrode, the second barrier portion covers the second electrode; and
an insulating layer, disposed on the epitaxial structure and covering the surface and a peripheral surface of the epitaxial structure, wherein the epitaxial structure comprises a first-type semiconductor layer, a light emitting layer and a second-type semiconductor layer, the light emitting layer is located between the first-type semiconductor layer and the second-type semiconductor layer, the insulating layer has a first opening exposing the first-type semiconductor layer and a second opening exposing the second-type semiconductor layer, the first electrode is disposed on the insulating layer and extends into the first opening and is electrically connected with the first-type semiconductor layer, and the second electrode is disposed on the insulating layer and extends into the second opening and is electrically connected with the second-type semiconductor layer;
wherein the first electrode has a first groove, the second electrode has a second groove, and the first barrier portion extends into the first groove and is conformally disposed with the first electrode, and the second barrier portion extends into the second groove and is conformally disposed with the second electrode; and
a solder layer, disposed on the barrier layer, wherein the solder layer is bonded to the corresponding pads, so that the micro light-emitting diode structures are electrically connected to the display substrate.

* * * * *